United States Patent [19]

Suzuki et al.

[11] Patent Number: 4,633,510
[45] Date of Patent: Dec. 30, 1986

[54] ELECTRONIC CIRCUIT CAPABLE OF STABLY KEEPING A FREQUENCY DURING PRESENCE OF A BURST

[75] Inventors: Fumiaki Suzuki; Toshiyuki Takeda, both of Tokyo; Takeo Inoue; Shigeo Nakajima, both of Kanagawa, all of Japan

[73] Assignees: NEC Corporation; Nippon Telegraph & Telephone Public Corporation, both of Japan

[21] Appl. No.: 687,343

[22] Filed: Dec. 28, 1984

[30] Foreign Application Priority Data

Dec. 28, 1983 [JP] Japan .................... 58-245435

[51] Int. Cl.⁴ .................................... H04B 1/00
[52] U.S. Cl. ............................. 455/69; 455/71; 455/12; 455/113; 455/118; 455/119
[58] Field of Search ............. 455/68, 69, 12, 113, 455/118, 119, 51, 213, 212, 71

[56] References Cited

U.S. PATENT DOCUMENTS

| 3,331,071 | 7/1967 | Webb | 455/12 |
| 4,066,845 | 1/1978 | Kishi | 455/212 |
| 4,326,297 | 4/1982 | Sato et al. | 455/213 |

Primary Examiner—Jin F. Ng
Assistant Examiner—Elissa Seidenglanz
Attorney, Agent, or Firm—Sughrue, Mion, Zinn, Macpeak, and Seas

[57] ABSTRACT

In a radio communication system, a transmitting section of a substation comprises a controlling circuit (21) for controlling a carrier frequency of a local oscillator (24) in response to a frequency deviation signal. A burst generating circuit (26) generates a burst in response to the input signal, a burst control signal, and a local oscillation signal of the carrier frequency. The transmitting section further comprises a holding circuit (34) responsive to a frequency control signal and the burst control signal. During presence of the burst control signal, the holding circuit holds the frequency control signal received before a beginning of the burst control signal to keep the carrier frequency of the local oscillation signal invariable until an end of the burst control signal. Otherwise, the frequency control signal passes through the holding circuit as it stands. Consequently, the carrier frequency of the local oscillation signal is controlled only during absence of the input signal and is kept invariable during presence of the input signal.

4 Claims, 5 Drawing Figures

ELECTRONIC CIRCUIT CAPABLE OF STABLY KEEPING A FREQUENCY DURING PRESENCE OF A BURST

BACKGROUND OF THE INVENTION

This invention relates to an electronic circuit for use in a single channel per carrier (often abbreviated to "SCPC") communication system and, in particular, to an electronic circuit within a transmitting section of the system that comprises a frequency controlling circuit.

In the manner known in the art, an SCPC communication system is used in a satellite communication system comprising a central station fixedly located at a predetermined terrestrial site, a satellite comprising a transponder, and at least one substation geographically spaced on the earth from the central station. In the SCPC communication system, a carrier wave of a single carrier frequency is assigned to a single communication channel. Such a single communication channel serves to transmit a communication signal, such as an audio signal, between the central station and the substation. In addition, a control channel is prepared to transmit a control signal between the central station and the substation and is common to both the central station and the substation. The control channel may be called a common signaling channel.

A frequency deviation of the carrier frequency inevitably takes place in the transponder of the satellite, as known in the art. A frequency control operation is carried out in the central station in order to compensate for the frequency deviation. In addition, a frequency deviation signal is transmitted from the central station as a control signal to the satellite through the common signaling channel.

The substation receives the communication signal through the satellite from the central station and derives information from the communication signal received on the communication channel allotted thereto. The substation also receives the frequency deviation signal from the satellite through the common signaling channel. The substation transmits information, corresponding to an input signal, to the satellite in the form of a burst at the carrier frequency, in accordance with a burst control signal produced in the manner known in the art. The burst control signal lasts during the period of time that the input signal is present. The substation has a frequency controlling unit for controlling the carrier frequency in response to the frequency deviation signal. Thus, the substation produces the burst, at the carrier frequency, under the control of the frequency controlling unit.

The frequency controlling unit comprises a local oscillator for producing a local oscillation signal, which has a variable frequency, as the carrier frequency.

In the frequency controlling unit, the carrier frequency of the local oscillation signal is continuously controlled, not only during absence of the input signal, but also during presence thereof. This means that the carrier frequency is widely varied during transmission of the burst, when the carrier frequency is controlled during presence of the input signal. A serious problem arises in the satellite. More specifically, the transponder of the satellite may have difficulty following the wide variation of the carrier frequency. As a result, the transponder may undesireably interrupt the communication channel allotted to the substation. In particular, the variation of the carrier frequency becomes large and serious when the local oscillator is a frequency synthesizer which generates a stepwise variable frequency.

SUMMARY OF THE INVENTION

It is therefore an object of this invention to provide an electronic circuit, comprising a frequency controlling circuit, which is capable of avoiding an controlling interruption during presence of the burst.

An electronic circuit to which this invention is applicable is for use in a single channel per carrier communication system. The electronic circuit comprises controlling means responsive to a frequency deviation signal for producing a frequency control signal, frequency producing means responsive to the frequency control signal for producing a local oscillation signal of a variable frequency, and burst generating means for generating a burst in response to an input signal, the local oscillation signal, and a burst control signal. The burst control signal lasts during the presence of the input signal and consequently has a beginning and an end. The electronic circuit further comprises holding means responsive to the frequency control signal and the burst control signal and coupled to the controlling means and the frequency producing means for holding the frequency control signal received before the beginning of the burst control signal to keep the frequency of the local oscillation signal invariable until the end of the burst control signal.

Figure 1:
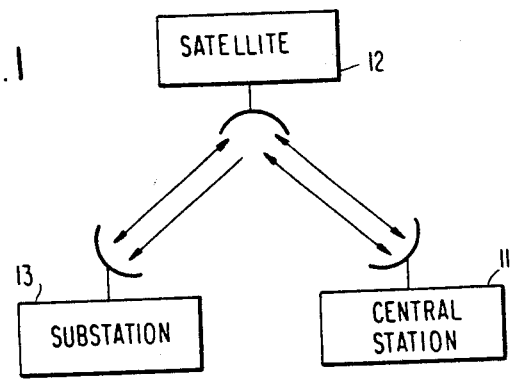
FIG. 1 is a block diagram of a single channel per carrier communication system comprising a central station, a satellite, and a substation.

DESCRIPTION OF THE PREFERRED EMBODIMENTS:

Referring to FIG. 1, a description will be made in order to facilitate an understanding of this invention with regard to a single channel per carrier communication system. The system comprises a central station 11 fixedly located at a predetermined terrestrial site, a satellite 12 located at a distance of about 35,000 kilometers above the equator of the earth, and at least one substation 13 geographically spaced on the earth from the central station 11.

Communication is carried out through the satellite 12 between the central station 11 and the substation 13 by the use of communication signals.

The central station 11 is operable in a known manner to carry out transmission and reception of the communication signals. A signal that is transmitted by the central station 11 may be called a central station signal. The central station signal is carried by a carrier signal of a predetermined carrier frequency f.

The satellite 12 comprises a transponder (not shown) which is operable in response to the communication signals and which repeats the communication signals to deliver the same to the central and the substations 11 and 13. The carrier frequency of the communication signal may be undesirably varied or deviated from a desired frequency, by the satellite 12 transponder. A variation or a deviation in frequency is monitored and cancelled by the central station 11.

For this purpose, the central station signal is transmitted from the central station 11 to the satellite 12 and returned to the central station 11. The central station 11 detects the variation or deviation of the carrier frequency by comparing the transmitted central station signal with the returned central station signal. Automatic frequency control is carried out in the central station 11 to cancel the frequency deviation. Simultaneously, the central station 11 transmits a frequency deviation signal representative of the frequency deviation to the satellite 12 through a common control or signaling channel. The frequency deviation signal is delivered to the substation 13 from the satellite 12.

The substation 13 receives the communication signals and the frequency deviation signal at a receiving section (not shown). The frequency deviation signal is sent through the receiving section to a transmitting section (not shown) in the known manner. Responsive to an input signal to be transmitted, the transmitting section produces a sequence of bursts carrying the input signal, with reference to the frequency deviation signal and a burst control signal that is produced in the manner known in the art. The burst is sent to the satellite 12 through a channel assigned to the substation 13.

Figure 2:
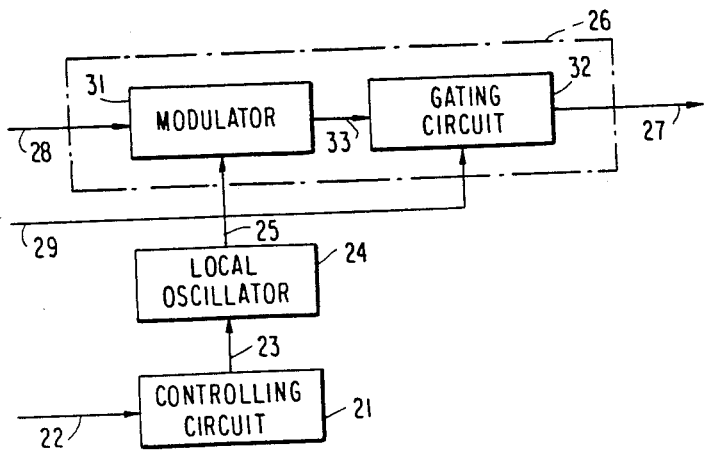
FIG. 2 is a block diagram of a conventional electronic circuit of a transmitting section used in the substation illustrated in FIG. 1.

Referring to FIG. 2, a description will be made with regard to a conventional transmitting section of the substation 13 (FIG. 1). The transmitting section comprises a controlling circuit 21 responsive to the frequency deviation signal (indicated at 22) for producing a frequency control signal 23. A local oscillator 24 is responsive to the frequency control signal 23 for producing a local oscillation signal 25 that has a variable frequency. The frequency is stepwise varied when a frequency synthesizer is used as the local oscillator 24. A burst generating circuit 26 is for generating the burst (indicated at 27) in response to the input signal (indicated at 28), the local oscillation signal 25, and a burst control signal 29. The burst control signal 29 is generated in synchronism with the input signal 28 in the manner known in the art. The burst control signal 29 lasts during presence of the input signal and consequently has a beginning and an end.

More specifically, referring to FIG. 2, the burst generating circuit 26 comprises a modulator 31 supplied with the input signal and the local oscillation signal 25. The modulator 31 carries out modulation of the input signal 28 in accordance with the local oscillation signal 25 and produces a modulated signal 33. Responsive to the burst control signal 29, a gating circuit 32 gates the modulated signal 33 into the burst 27 only during presence of the burst control signal 29. In other words, the burst appears during presence of the input signal 28.

Supplied with the frequency deviation signal 22, the controlling circuit 21 supplies the local oscillator 24 with the frequency control signal 23 and controls the frequency of the local oscillation signal 25 so as to cancel or eliminate the frequency deviation occurring in the satellite 12 (FIG. 1).

It is assumed that the frequency deviation and a desired frequency are represented by $\Delta f$ and $f_1$, respectively. The local oscillation signal 25 has a frequency $f_2$ given by:

$$f_2 = f_1 \pm \Delta f.$$

The frequency $f_2$ of the local oscillation signal 25 is continuously controlled not only during absence of the input signal 28 but also during presence thereof. On the contrary, there is a case where the frequency of the local oscillation signal 25 is widely and stepwise varied during transmission of the burst 27, as mentioned before. However, the transponder of the satellite 12 has difficulty following the wide variation of the frequency of the burst.

Figure 3:
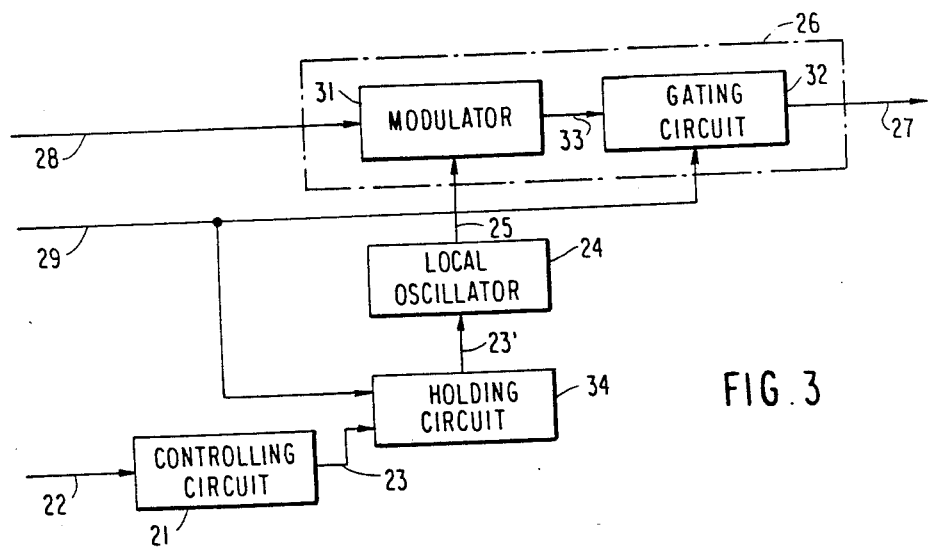
FIG. 3 is a block diagram of an electronic circuit according to a first embodiment of this invention.

Referring to FIG. 3, a transmitting section of the substation 13 (FIG. 1) according to a first embodiment of this invention comprises similar parts designated by like reference numerals in FIG. 2. The transmitting section further comprises a holding circuit 34 for producing a modified frequency control signal 23' in response to the frequency control signal 23 and the burst control signal 29. During the presence of the burst control signal 29, the holding circuit 34 supplies the local oscillator 24, as the modified frequency control signal 23', with the frequency control signal 23 received just before the beginning of the burst control signal 29. As a result, the frequency of the local oscillation signal 25 is kept invariable until the end of the burst control signal 29.

On the other hand, the holding circuit 34 allows the frequency control signal 23 to pass therethrough, as the modified frequency control signal 23', during absence of the burst control signal 29. Thus, the frequency of the local oscillation signal 25 is controlled by the frequency control signal 23, which varies with time and effectively cancels the frequency deviation in the transponder of the satellite 12 (FIG. 1).

As mentioned above, the frequency of the local oscillation signal 25 is controlled only during the absence of the input signal 28 and is kept invariable during the presence of the input signal 28. Accordingly, even if the frequency synthesizer is used for the local oscillator, the transponder of the satellite 12 is capable of following the variation of the frequency of the burst.

Figure 4:
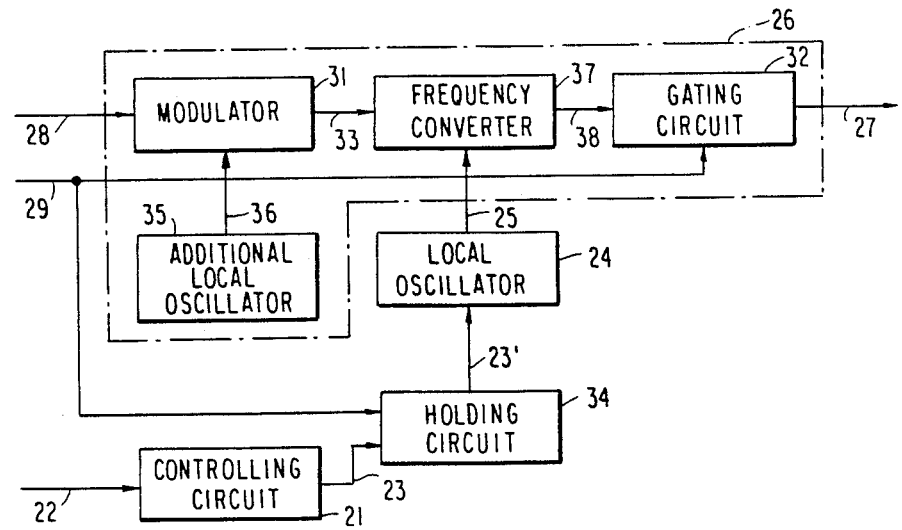
FIG. 4 is a block diagram of an electronic circuit according to a second embodiment of this invention.

Referring to FIG. 4, the burst generating circuit 26 comprises the modulator 31, an additional local oscillator 35 for supplying an additional local oscillation signal 36 to the modulator 31, a frequency converter 37 coupled to the modulator 31 for carrying out frequency conversion of the modulated signal 33 in response to the local frequency signal 25 to produce a frequency converted signal 38, and the gating circuit 32. The frequency converter 37 serves as an up converter known in the art.

Figure 5:
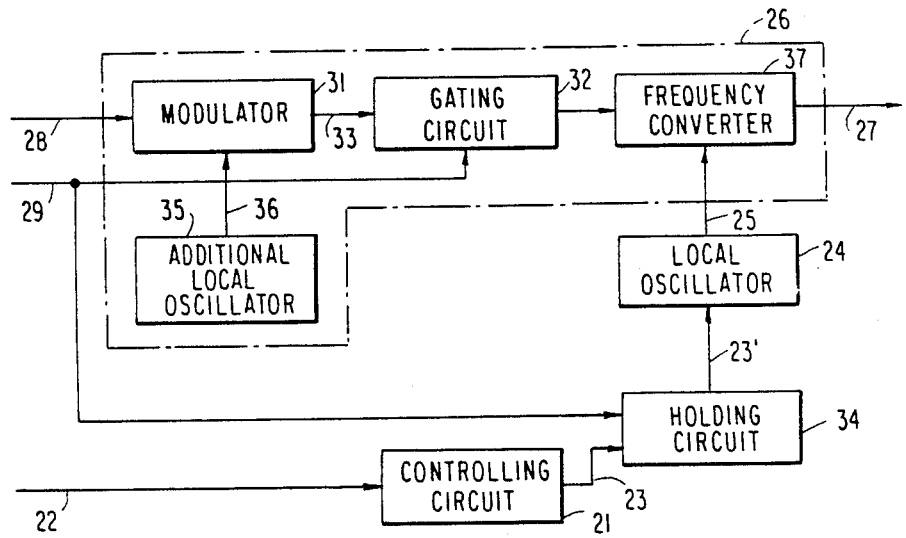
FIG. 5 is a block diagram of an electronic circuit according to a third embodiment of this invention.

Referring to FIG. 5, the burst generating circuit 26 is similar to that illustrated with reference to FIG. 4 except that the gating circuit 32 is interposed between the modulator 31 and the frequency converter 37.

While this invention has so far been described in conjunction with a few preferred embodiments thereof, it will now be possible for those skilled in the art to put the invention into practice in various other manners. The burst control signal may be generated in response to a carrier switching signal appearing before information. In this event, the input signal may include the carrier switching signal in addition to the information.

What is claimed is:

1. In an electronic circuit comprising controlling means responsive to a frequency deviation signal for producing a frequency control signal, frequency producing means responsive to said frequency control signal for producing a local oscillation signal of a variable frequency, and burst generating means for generating a burst in response to an input signal, said local oscillation signal, and a burst control signal which is present during the presence of said input signal and which has a beginning and an end, said burst appearing between the beginning and the end of said burst control signal, the improvement wherein said circuit further comprises:

holding means responsive to said frequency control signal and said burst control signal and coupled to said controlling means and said frequency producing means for holding the frequency control signal received before the beginning of said burst control signal to keep said frequency of the local oscillation signal invariable until the end of said burst control signal.

2. An electronic circuit as claimed in claim 1, said burst generating means comprising a modulator responsive to said input signal for carrying out modulation of said input signal in accordance with a carrier signal to produce a modulated signal and gating means coupled to said modulator for gating said modulated signal in response to said burst control signal to produce said burst, wherein said local oscillation signal is supplied as said carrier signal to said modulator.

3. An electronic circuit as claimed in claim 1, wherein said burst generating means comprises a modulation circuit responsive to said input signal for carrying out modulation of said input signal to produce a modulated signal, a frequency converter coupled to said modulation circuit for carrying out frequency conversion of said modulated signal in response to a local frequency signal to produce a frequency converted signal, and a gate circuit for gating said frequency converted signal in accordance with said burst control signal to produce said burst, wherein said local oscillation signal is supplied as said local frequency signal to said frequency converter.

4. An electronic circuit as claimed in claim 1, wherein said burst generating means comprises a modulation circuit responsive to said input signal for carrying out modulation of said input signal to produce a modulated signal, a gate circuit for gating said modulated signal in response to said burst control signal to produce a gated signal, and a frequency converter for carrying out frequency conversion of said gated signal in response to a local frequency signal to produce a frequency converted signal as said burst, wherein said frequency producing means is connected to said frequency converter to supply the same with said local oscillation signal as said local frequency signal.

* * * * *

UNITED STATES PATENT AND TRADEMARK OFFICE
CERTIFICATE OF CORRECTION

PATENT NO. : 4,633,510
DATED : December 30, 1986
INVENTOR(S) : Suzuki et al

It is certified that error appears in the above-identified patent and that said Letters Patent is hereby corrected as shown below:

Column 2, line 7   Delete "controlling" and insert
--undesired--;

Signed and Sealed this

Fourteenth Day of April, 1987

Attest:

DONALD J. QUIGG

*Attesting Officer*   *Commissioner of Patents and Trademarks*